United States Patent [19]

Freeman, III

[11] Patent Number: 5,234,530
[45] Date of Patent: Aug. 10, 1993

[54] APPARATUS FOR CONTROLLING ASSEMBLY FORCE

[75] Inventor: Davis Freeman, III, Elkton, Md.

[73] Assignee: Eastman Kodak Company, Rochester, N.Y.

[21] Appl. No.: 702,868

[22] Filed: May 20, 1991

[51] Int. Cl.$^5$ ............................................. B32B 31/00
[52] U.S. Cl. ..................................... 156/358; 156/359; 156/364; 156/378
[58] Field of Search ................. 156/64, 378, 358, 359, 156/364

[56] References Cited

U.S. PATENT DOCUMENTS

| | | |
|---|---|---|
| 672,226 | 4/1901 | Dorticus . |
| 856,915 | 6/1907 | Sauerbier . |
| 902,436 | 10/1908 | McFarland . |
| 954,353 | 4/1910 | Skow . |
| 983,153 | 1/1911 | Lowe et al. . |
| 990,719 | 4/1911 | Fisher . |
| 1,248,184 | 11/1917 | Silverstene . |
| 1,537,191 | 5/1925 | Reynolds . |
| 2,065,694 | 12/1936 | Hatcher ........................ 88/14.2 |
| 2,212,438 | 8/1940 | Freed ........................... 101/368 |
| 3,094,920 | 6/1963 | Priesmeyer ................... 101/41 |
| 3,861,983 | 1/1975 | Harrell ........................ 156/359 |
| 4,613,392 | 9/1986 | Klar et al. ................... 156/378 |
| 4,631,685 | 12/1986 | Peter ........................... 156/378 |
| 4,682,182 | 7/1987 | Oyama et al. ................ 346/1.1 |
| 4,803,124 | 2/1989 | Kunz ............................ 428/200 |
| 4,820,365 | 4/1989 | Brumm et al. ............... 156/359 |
| 4,909,869 | 3/1990 | Sakamoto et al. ........... 156/364 |
| 4,913,763 | 4/1990 | Yamazaki et al. ........... 156/358 |
| 4,980,002 | 12/1990 | Dzarnoski, Jr. et al. ..... 156/378 |
| 5,080,736 | 1/1992 | Matsui .......................... 156/64 |
| 5,110,381 | 5/1992 | Heckard et al. .............. 156/64 |

*Primary Examiner*—David A. Simmons
*Assistant Examiner*—William J. Matney, Jr.
*Attorney, Agent, or Firm*—Stephen C. Kaufman

[57] ABSTRACT

A system of assembling devices to substrates is disclosed. A pattern of lines and/or dots of bonding medium is formed on a substrate to provide a uniform support for the device. Apparatus and a method for applying the bonding medium to the substrates is also disclosed. The bonding medium is applied to the substrates with transfer surfaces formed on a movable tool. The transfer surfaces are formed in a configuration that matches a desired pattern of the lines and/or dots of the bonding medium. Also, an assembly method is disclosed in which devices are pressed onto the adhesive lines and/or dots with an assembly tool that is moved with a precisely controlled force. In addition apparatus and a method of curing an adhesive interface between the assembled devices and substrates is disclosed. Use of the curing apparatus and method limits any relative lateral movement between the devices and the substrates during curing.

2 Claims, 9 Drawing Sheets

APPARATUS FOR CONTROLLING ASSEMBLY FORCE

CROSS-REFERENCE TO RELATED PATENT APPLICATIONS

The present invention is related to three copending U.S. Patent Applications. The first related application, Ser. No. 628,978, filed Dec. 12, 1990 with inventors E. Carnall, D. Freeman and J. Y. Kaukeinen, is entitled "Techniques for Attaching Devices to Supports" and has a common assignee with the present patent application. The second related application, Ser. No. 702,877, which is being filed concurrently with the present patent application, is entitled "Method and Apparatus for Curing An Adhesive Interface", has a common assignee with the present patent application and has as its inventors, E. Carnall and E. J. Ozimek., The third related application, Ser. No. 702,867, which is being filed concurrently with the present patent application, is entitled "Method and Apparatus for Transferring Bonding Medium to Substrates", has a common assignee with the present patent application and has as its inventors, E. J. Ozimek, J. L. Suess and E. Carnall.

FIELD OF THE INVENTION

The present invention relates to an apparatus that controls assembly forces during assembly of one object with another object.

BACKGROUND OF THE INVENTION

In manufacturing semiconductor devices and integrated circuits, wafer-shaped or linear devices are commonly secured to a support, a substrate or a package. Various techniques have been devised to bond or cement such devices to a support, substrate or package.

U.S. Pat. No. 4,803,124 (R. Kunz), issued on Feb. 7, 1989, discloses a technique for bonding semiconductor chips to a mounting surface utilizing adhesive applied in starfish patterns. Kunz teaches depositing an adhesive material in a starfish pattern comprising a raised central portion disposed at the intersection of a plurality of radial arms. The bonding surface of the semiconductor chip is pressed against the adhesive deposit to cause the adhesive to uniformly and symmetrically spread therebeneath across the bonding surface and bond the two surfaces. Kunz also describes a prior art technique of placing five droplets of an adhesive in an "X" shape on a support surface using five hypodermic needles.

Typically in these techniques, a silver-filled thermally polymerizable conductive adhesive is disposed between the back surface of the device and the front surface of the package or substrate. Most of these techniques use a single continuous line of adhesive or a single row of spaced-apart dots of adhesive disposed along the long axis of the device for attaching the device to a support or substrate. The device is then placed on the adhesive by some means and properly aligned. The adhesive is then thermally cured to bond the device to the support or substrate.

Referring now to FIGS. 1 and 2, there is shown an exemplary arrangement of the above-described technique which uses a single row of dots of adhesive 12. More particularly, FIG. 1 is a front view showing a portion of a support, substrate or package 10, a dot of adhesive 12 (which is the first dot of adhesive 12 of the single row of dots 12 formed therebehind) disposed on the support or substrate 10, and a device 14 which has its long axis centrally positioned on the peaks of the row of dots of adhesive 12. FIG. 2 is a top view of the exemplary arrangement of FIG. 1 showing a non-continuous row of 16 dots of adhesive 12 (8 dots of adhesive 12 in each section), but it is to be understood that such row of dots of adhesive 12 could be continuous. It is to be further understood that for the alternative technique using a single continuous line of adhesive (not shown), the arrangement would look the same as the front view of FIG. 1, and only a side view and the top view of FIG. 2 would appear different in that the dots of adhesive 12 would be interconnected to form a continuous line of adhesive.

Referring now to FIG. 3, there is shown a result which can occur after the single row of dots of adhesive 12 of FIGS. 1 and 2 is thermally cured. As is illustrated in FIGS. 1 and 3, as the dots of adhesive 12 heat up during the curing process, the viscosity of the adhesive decreases and the adhesive flows to allow the device 14 to move and/or tilt uncontrollably depending on how the device 14 was positioned on the dots of adhesive 12. A similar result can occur using the single line of adhesive.

Such techniques are suitable for applications which do not require precise positioning of one or more devices 14 on the substrate or package 10. However, for some applications, each device 14 has to be precisely placed with a predetermined tolerance (e.g., at most ±15 microns) in the X and Y directions and not shift to exceed such tolerance on the thermal curing of the adhesive. As illustrated in FIGS. 1 and 3, the above-described conventional techniques are not useful for providing such precise positioning of the device 14 on the support, substrate or package 10.

Typically, when there is a need to assemble electronic devices (e.g., charge coupled integrated circuit chips) with high precision, the assembly is performed using elaborate and expensive manual techniques assisted with product-specific assembly fixtures. A need for product-specific fixtures typically produces inordinately high assembly costs. Additionally, any changes in product design are preceded by long lead times.

It has been a long sought after goal to provide a flexible and automated system of assembling (attaching) electronic devices to substrates using a bonding medium wherein the electronic devices are accurately located on the substrates. To be practical, such a system needs to be adaptable to the production of a wide range of product configurations. There are many problems associated with developing such an automated assembly system. For example, it is difficult to apply a bonding medium or adhesive to substrates in a manner that provides sufficient uniformity of support for the devices being assembled with the substrates.

Additionally, there is no known prior art way to automatically place a wide variety of devices (IC's) onto an adhesive coating on a substrate. Prior to curing the adhesive, the devices must be pressed onto the surface of the adhesive to assure that there is no movement of the devices during curing. The pressing of the devices onto the adhesive must be performed with a very carefully controlled force, typically in the range of between 5 to 20 grams with a tolerance of ±0.05 grams. A force that is too high causes the fragile devices to break. A force that is too low fails to properly seat the devices onto the adhesive. Because the devices have various thicknesses, it has been impractical to automatically control such a force within the limits required for successful assembly of the devices.

In prior art assembly methods, the devices were placed onto the adhesive coated substrates and the substrates were loaded into a high temperature oven to cure the bonding medium or adhesive. In spite of the exercise of extreme care in the formation of a uniform supporting base of adhesive and placement of the devices onto desired locations, the assemblies emerged from the oven with a slightly different positioning of the devices relative to the substrates. The cause of this variation of positioning was not fully understood, but it was assumed that the variations were caused by some physical distortions of the adhesive that occurred during curing.

After a careful and more insightful examination of this problem, it has been discovered that this undesirable phenomenon is a result of environmental vibration (i.e., vibrations caused by movements of vehicles and heavy objects in the vicinity of the curing operation or vibrations from sources such as fans in a curing oven) which produces lateral movement of the devices relative to the substrates while the adhesive is in a fluid state. There has heretofore been no recognition that such vibration is a problem.

It is desirable therefore to have an automated system for assembling devices to substrates using a bonding medium (e.g., adhesive) which results in the devices being accurately positioned and well secured to the substrate. Furthermore, the desired system should be adaptable to the production of a wide range of product configurations and produce high yields.

SUMMARY OF THE INVENTION

The present invention is directed to an apparatus for assembling a first object to a second object with a predetermined force. The apparatus supports the first object and moves the second object relative to the first object. A moving means has a driven member and a floating member adapted to hold the second object. The driven member and the floating member are coupled to each other with a deflecting member. The driven member has a distance sensor coupled thereto which is adapted to measure a displacement of the floating member relative to the driven member. The sensor is coupled to a control means adapted to move the driven member to place the second object into contact with the first object and then continue the movement of the driven member until the sensor has measured a predetermined displacement of the floating member relative to the driven member.

Viewed from another aspect, the present invention is directed to an apparatus for assembling a first object to a second object with a predetermined force. The apparatus comprises means for supporting the first object and means for moving the second object relative to the first object. The moving means has a driven member and a floating member. The driven member and the floating member are coupled to each other with a deflecting member. The floating member is adapted to hold the second object. The driven member has a distance sensor coupled thereto. The distance sensor is adapted to measure a displacement of the floating member relative to the driven member. The sensor is coupled to a control means adapted to move the driven member to place the second object into contact with the first object and continue the movement of the driven member until the sensor has measured a predetermined displacement of the floating member relative to the driven member.

Viewed from yet another aspect, the present invention is directed to an apparatus for facilitating the bonding of a semiconductor device to a substrate via an adhesive interface therebetween. The apparatus comprises means for supporting the substrate and means for moving the semiconductor device relative to the substrate. The moving means has a driven member and a floating member. The driven member and the floating member are coupled to each other with a deflecting member. The floating member is adapted to hold the semiconductor device. The driven member has a distance sensor coupled thereto. The distance sensor is adapted to measure a displacement of the floating member relative to the driven member. The sensor is coupled to a control means adapted to move the driven member to place the semiconductor device into contact with an adhesive interface formed on the substrate and continue the movement of the driven member until the sensor has measured a predetermined displacement of the floating member relative to the driven member.

The invention will be better understood from the following detailed description taken in consideration with the accompanying drawings and claims.

The drawings are not necessarily to scale.

DETAILED DESCRIPTION

The present invention is useful in the fabrication of assemblies of objects such as those shown in FIGS. 4 through 10. These figures show arrangements of devices and substrates which are disclosed and claimed in pending U.S. patent application Ser. No. 628,978 which is cited in the Cross Reference to Related Patent Applications section hereinabove.

Figure 1:
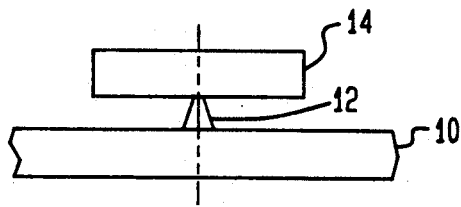
FIG. 1 is a front view of a prior art arrangement of a support or substrate with a device placed on the peak of a dot of adhesive which is the first dot of a row of such dots formed therebehind.
Figure 3:
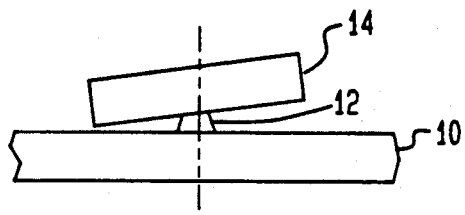
FIG. 3 is a front view of the prior art arrangement of FIG. 1 showing a possible result after the adhesive dots have been thermally cured.
Figure 4:
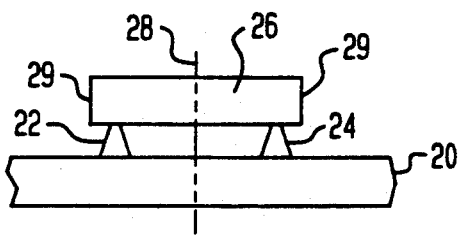
FIG. 4 is a front view of an arrangement of a support or substrate with a device placed on the peaks of a first and a second dot of adhesive which are the first dots of a first and second row of adhesive dots, respectively, formed therebehind, which arrangement can be advantageously produced with the present invention.
Figure 2:
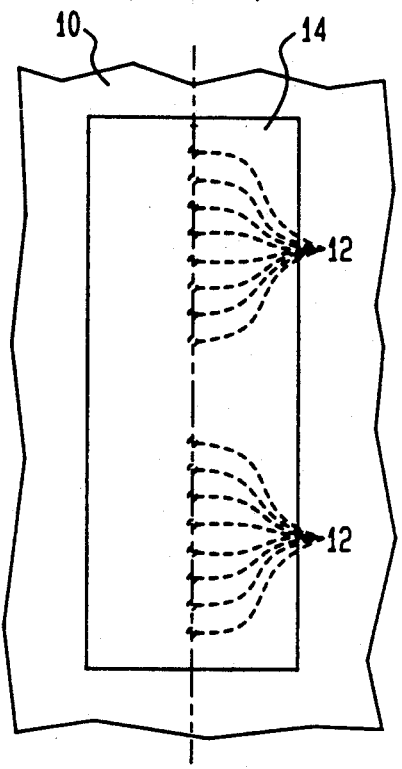
FIG. 2 is an exemplary top view of the prior art arrangement of FIG. 1.

Referring now to FIG. 4, there is shown a front view of an arrangement for mounting a device 26 on a support or substrate 20. More particularly, the arrangement of FIG. 4 comprises the support or substrate 20, a first and a second dot of adhesive 22 and 24, respectively, which are the first dots of a respective first and second row of dots of adhesive 22 and 24, respectively, formed therebehind, and the device 26 which has long edges 29 thereof positioned parallel to the first and second rows of dots of adhesive 22 and 24. For purposes of discussion hereinafter, it is assumed that the device 26 is a rectangular or wafer-like device such as, for example, a linear CCD sensor, with a planar surface that is positioned on the peaks of the first and second row of dots of adhesive 22 and 24. The first and second row of dots of adhesive 22 and 24 are preferably disposed equidistant from a centerline 28 of the device.

In the context of the description of the present invention, one use of the term "device" is to describe objects that are comprised of semiconductor material in the form of die or chips on which are formed various electrically functional elements (e.g., transistors, resistors, capacitors and etc.). In this context, the term "device" is intended to describe a semiconductor chip or die which has at least one and typically a plurality of electrical elements.

Figure 5:
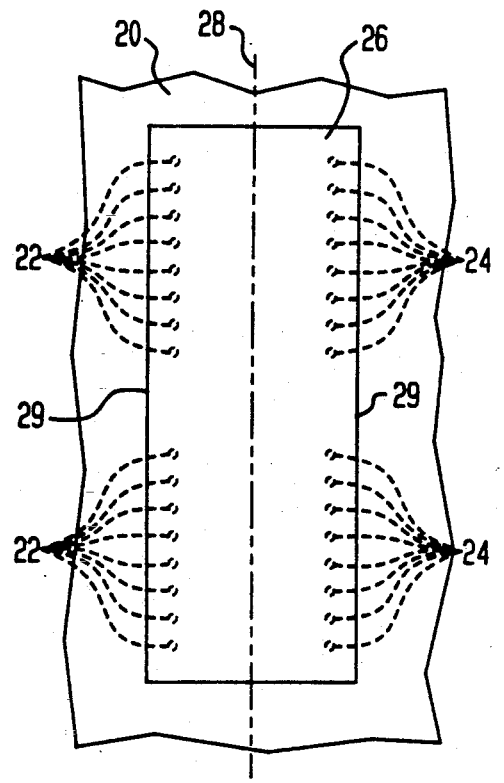
FIG. 5 is an exemplary top view of the arrangement of FIG. 4.

Referring now to FIG. 5, there is shown an exemplary top view of the arrangement of FIG. 4 with the first and second row of dots of adhesive 22 and 24 being non-continuous. It is to be understood that the first and second row of dots of adhesive 22 and 24 can be continuous or non-continuous to provide an arrangement which uniformly supports device 26. More particularly, in the arrangement of FIGS. 4 and 5, the first and second rows of dots of adhesive 22 and 24, respectively, are disposed substantially parallel to the long edges 29 of the rectangular or wafer-like device 26 (as stated above), and are of near equal shape and volume to cause the adhesive dots 22 and 24 to contact and uniformly support the device 26 near the long edges 29 of the device 26. Additionally, it is preferable that each row of the dots of adhesive 22 and 24 be positioned outwards from a centerline 28 of device 26 by an equal amount.

Figure 6:
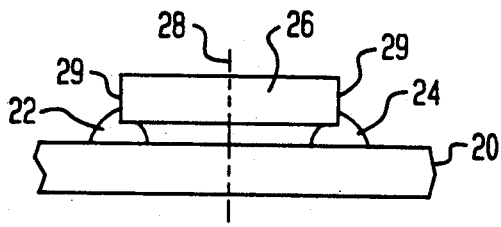
FIG. 6 is a front view of the arrangement of FIG. 4 showing the result after the adhesive dots in both rows have been thermally cured.

Referring now to FIG. 6, there is shown a front view of the arrangement of FIG. 4 showing the result after the first and second rows of dots of adhesive 22 and 24 have been thermally cured. More particularly, during an initial heating phase of a curing process, the viscosity of the adhesive decreases, and the adhesive flows. When such dots of adhesive 22 and 24 have substantially an equal shape and volume, each dot of adhesive 22 and 24 flows downwards and outwards around the original pattern because the device 26 is uniformly supported by each of the dots of adhesive 22 and 24. This arrangement of dots of adhesive 22 and 24 produces at most only minute or negligible sideways forces in each of the flowing dots of adhesive 22 and 24 as the adhesive polymerizes in a later phase of the curing process. Therefore, the device 26 settles substantially straight downwards and is prevented from shifting beyond an exemplary tolerance of ±15 microns during the thermal adhesive polymerization process, thereby providing precise positioning of the device 26. During the curing process, the dots of adhesive 22 and 24 disposed near the long edges 29 of the device 26 spread out from under and support the long edges 29 of the device 26 as shown in FIG. 6.

It is to be understood that any suitable adhesive can be used, such as, for example, a silver filled thermally polymerizable conductive adhesive such as "Ablebond 84 1LMi" obtainable from the Ablestik Company. Such exemplary adhesive is a thermally polymerizable silver filled epoxy which is both thermally and electrically conductive.

Figure 7:
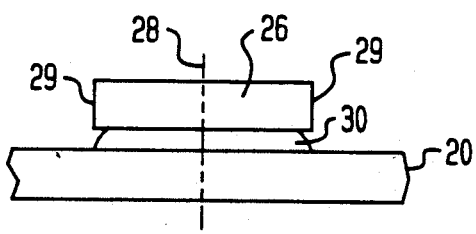
FIG. 7 is a front view of an arrangement of a support or substrate with a device mounted on the peak of a line of adhesive which is the first line of a plurality of substantially parallel lines of adhesive formed therebehind, which arrangement can be advantageously produced with the present invention.

Referring now to FIG. 7, there is shown a front view of another adhesive pattern. In FIG. 7, a line of adhesive 30 is positioned substantially perpendicular to the long edges 29 and centerline 28 of the exemplary rectangular or wafer-shaped device 26. In the front view of FIG. 7, it is to be understood that a plurality of similar substantially parallel spaced-apart lines of adhesive 30 are formed behind the illustrated line of adhesive 30. As shown in FIG. 7, each line of adhesive 30 has a length which approximates the width of the device 20 to be positioned thereon to uniformly support the device 26 therealong. It is to be understood that the series of parallel spaced-apart lines of adhesive 30 may extend from one end of the device 26 to the other end along its entire length, or over one or more portions of the entire length as, for example, near the two ends and the middle of the device 26.

Figure 8:
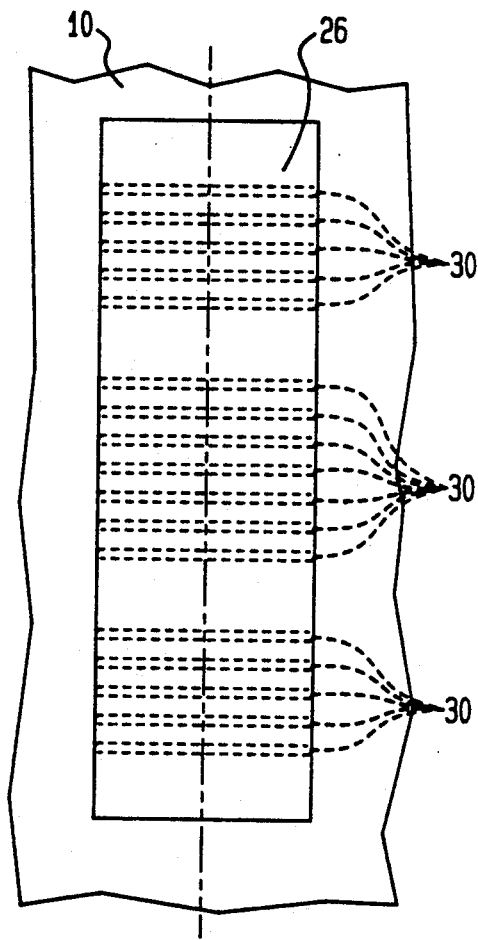
FIG. 8 is an exemplary top view of the arrangement of FIG. 7.

Referring now to FIG. 8, there is shown an exemplary top view of the arrangement of FIG. 7, wherein the lines of adhesive 30 are divided into three sections where each end section is shown as comprising an exemplary 5 lines of adhesive 30, and the center section is shown as comprising an exemplary 7 lines of adhesive 30. It is to be understood that the lines of adhesive 30 can be continuous or non-continuous down the length of the device 26, but the lines of adhesive 30 should form a pattern which uniformly supports the device 26. Additionally, any number of lines of adhesive 30 can be used for each section or over the continuous length, and will usually comprise many more lines of adhesive 30 than shown in FIG. 8.

Figure 9:
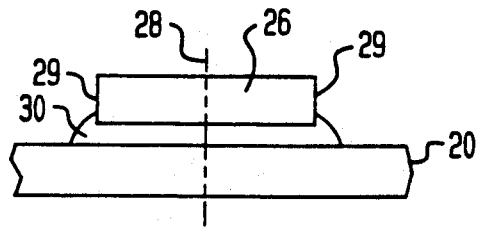
FIG. 9 is a front view of the arrangement of FIG. 7 showing the result after the adhesive lines have been thermally cured.

Referring now to FIG. 9, there is shown a front view of the arrangement of FIG. 7 illustrating the result after the lines of adhesive 30 of FIG. 7 have been thermally cured. As with the dots of adhesive 22 and 24 of FIGS. 4 and 6, the lines of adhesive 30 uniformly support the device 26 and prevent the device 26 from shifting beyond the exemplary tolerance of, for example, ±15 microns during the thermal polymerization process, thereby providing precise positioning. More particularly, during the curing process, the adhesive will first flow and then polymerize. When such lines of adhesive have substantially an equal shape and volume, each line of adhesive flows downwards and outwards around the original pattern because the device 26 is uniformly supported by each of the lines of adhesive. In other words, this arrangement will produce at most only minute or negligible sideways forces in each of the flowing lines of adhesive as the adhesive polymerizes. Therefore, the device 26 settles straight downwards and is prevented from shifting beyond the exemplary tolerance of ±15 microns during the thermal adhesive polymerization process to provide precise positioning.

Figure 10:
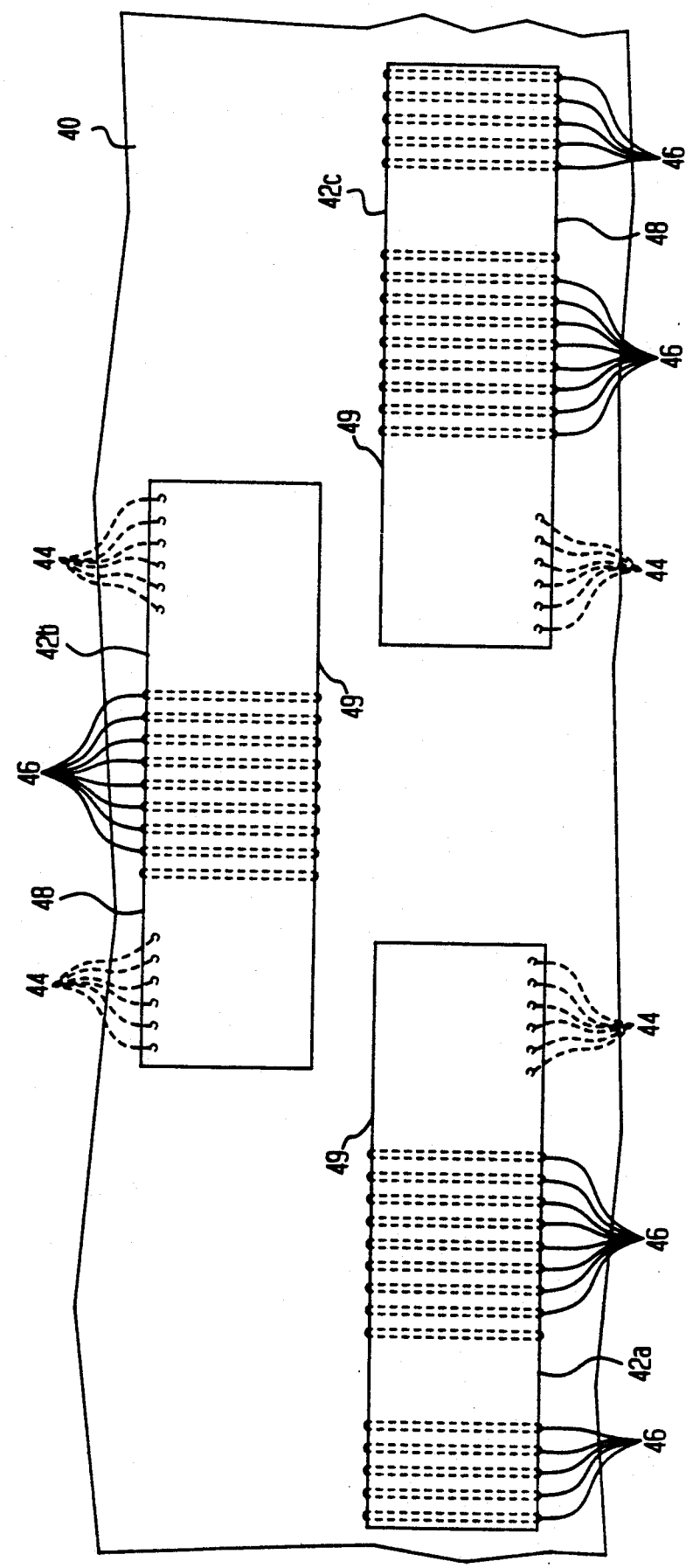
FIG. 10 is a top view of an exemplary arrangement of a portion of a support of substrate with three closely-spaced, side-by-side, staggered or overlapping devices positioned on a combination of a row of dots of adhesive and parallel lines of adhesive, which arrangement can be advantageously produced with the present invention.

Referring now to FIG. 10, there is shown a top view of a portion of a support or substrate 40 on which a plurality (in this case three) of devices 42a, 42b and 42c are positioned in a closely spaced, side-by-side staggered (overlapping) exemplary arrangement. A single row of dots of adhesive 44 (similar to that shown in FIG. 4) is used towards the ends of the devices 42a, 42b, and 42c where the devices overlap each other (having a portion of the device lying adjacent to another device). Additionally, a plurality of lines of adhesive 46 (as described for FIGS. 7 and 8) are used in the central area and towards the ends of devices 42a, 42b, and 42c where the devices do not overlap each other. For example, the device 42a uses a separate plurality of substantially parallel lines of adhesive 46 (which are substantially perpendicular to the long edge 48 of the device) at the central area and the left end where the device 42a does not overlap another device. At the end where device 42a overlaps the end of device 42b, each of the two devices 42a and 42b are shown as comprising a single row of dots of adhesive 44 which are parallel to, and inside, the long edge 48 of the device. Long edge 48 is disposed opposite the long edge 49 of the device that lies adjacent the corresponding long edge 49 of the other device. A similar configuration of adhesive dots 44 and adhesive lines 46 is used between overlapping and non-overlapping sections, respectively, of the devices 42c and 42b. Since the first and second ends of device 42b overlap and lie adjacent to the ends of devices 42a and 42c, respectively, device 42b comprises a row of adhesive dots 44 at each of the first and second ends, and parallel lines of adhesive 46 at the central portion of device 42b where this device does not overlap another device.

As described above, a single row of adhesive dots 44 is used at each end of the device where that device overlaps another device. The reason for this is that the device 42a, 42b or 42c must be supported at its end(s) because that is where wire bonds are generally made between the device 42a, 42b, and 42c and the associated external circuits. Additionally, the use of a single row of adhesive dots 44 at the end(s) of the devices 42 (where the end(s) overlap other devices) and within the boundary of the long edges 48 minimizes the amount of adhesive used and prevents the adhesive from protruding beyond the outside dimensions of the device when the adhesive is thermally polymerized.

Generally, the devices are positioned within 3-4 mils of each other in the overlap regions, and if the adhesive squirts or flows out from under the devices, the adhesive from one device could cause an adjacent device to shift. It is to be understood that the illustration in FIG. 10 of six dots of adhesive 44 at each overlapping end of devices 42a, 42b and 42c is merely for purposes of exposition and not for purposes of limitation. At each of these overlapping ends, there could be any number of dots of adhesive 44 in a row as, for example, 30-35 dots. Similarly, it is to be understood that the number of lines of adhesive 46 shown in FIG. 10 for each section of devices 42a, 42b and 42c are merely for purposes of illustration, and that any number of such lines of adhesive 46 can be used that will uniformly cradle the associated device and prevent shifting during thermal polymerization. Additionally, the lines of adhesive 46 could be disposed over the entire non-overlapping portions of each of devices 42a, 42b, and 42c rather than under separate portions thereof, but any arrangement can be used which will uniformly cradle each device and prevent shifting of the device upon thermal polymerization of the adhesive.

It can be seen from the preceding description that in the context of applying devices to substrates, there is a need to form a wide variety of precisely controlled patterns of bonding medium on substrates. In a typical manufacturing operation, it is desirable to quickly change from producing one type of product to another type of product. Such changes often require a changing of the patterns of bonding medium that are applied to the substrates. An apparatus for applying devices to substrates that is readily adaptable to changes of product design is shown in FIG. 11.

Figure 11:
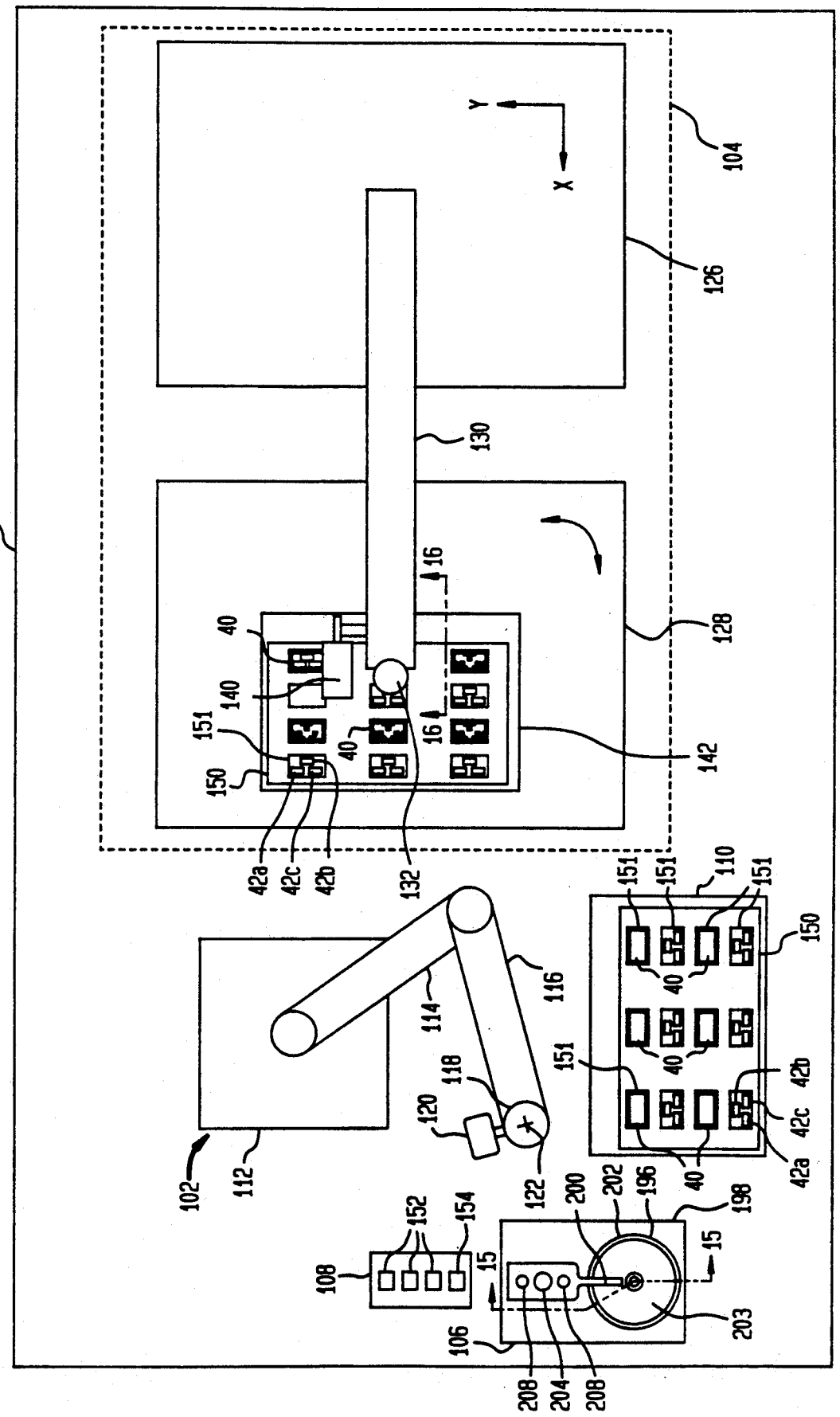
FIG. 11 is a schematic top view that shows symbolically an apparatus that embodies certain force control features in accordance with the present invention.

Referring now to FIG. 11 there is shown schematically an apparatus 100 for mounting devices onto substrates. The apparatus 100 has certain assembly force control features which operate in accordance with the present invention. The apparatus 100 comprises a first robotic unit (manipulator or robot) 102, a second manipulator 104 (shown within a dashed line rectangle), an adhesive source 106, a rack 108 for holding various tools for the robot 102 and a pallet support 110.

The adhesive source 106 comprises a rotatable adhesive wheel 196, a support stand 198, and an adjustable skimming blade 200. The adhesive wheel 196 is provided with a raised lip 202 that forms a container for adhesive 203. The skimming blade 200 is coupled to the support stand 198 with a spring-loaded adjusting screw 204. The skimming blade 200 is also supported with two guide pins 208. The adhesive source 106 is shown with additional detail in a cross-sectional view taken through the dashed lines 15—15 in FIG. 15.

One example of a manipulator which is used in a preferred embodiment of the apparatus 100 as the robot 102 is a Model Adept 2 Four Axis SCARA Robot available from Adept Technology, Inc. An example of a manipulator which is used in a preferred embodiment of the apparatus 100 as the manipulator 104 is a Three Stage Micropositioning Table available from Kensington Corp. coupled with a Daedel Linear Stage/Compumotor Drive available from Daedel Corp.

For illustrative purposes, the apparatus 100 is shown assembling the devices 42a, 42b and 42c to the substrates 40 in the configuration shown in FIG. 10. For purposes of simplicity, the devices are denoted hereinbelow with the numeral 42 whenever there is no need to distinguish, for example, the device 42a from the devices 42b and 42c.

The robot 102 comprises a base 112, first and second movable arms 114 and 116, respectively, a tool holder 118 and a camera 120. An operating axis or end effector of the robot 102 is shown with two short crossed lines that intersect at a point designated by a number 122.

The robot 102 operates by translating the point 122 to various locations on the apparatus 100. When the point 122 is at a desired location, the tool holder 118 is moved vertically to perform a desired function.

The manipulator 104 comprises an x-y stage 126, a rotatable stage 128, a support beam 130, a die collet drive 132, a camera 140, and a pallet support 142. The support beam 130 is coupled to the x-y stage 126. The die collet drive 132 is coupled to the support beam 130. The rotatable stage 128 is positioned under the die collet drive 132. This arrangement allows the die collet drive 132 to be moved, in an x-y plane, to various locations above the rotatable stage 128. When the die collet drive 132 is at a desired location, a die collet (not shown in FIG. 11 but shown in FIGS. 16, 17 and 18) is moved vertically to perform a desired operation. The rotatable stage 128 rotates the pallet support 142 under the die collet drive 132.

In operation, the apparatus 100 performs assembly of the devices 42 to the substrates 40 in response to programmed commands executed by the robot 102 and the manipulator 104. Initially, a pallet 150 containing a number of the devices 42 and the substrates 40 is placed onto the pallet support 110 by an operator. The devices 42 and the substrates 40 are held in cavities 151 formed in the pallet 150. The apparatus 100 performs the desired assembly without any further intervention or attention from the operator.

After the pallet 150 is in place, the robot 102 moves the point 122 to a position over the tool rack 108. The tool holder 118 is lowered and engages with an adhesive transfer tool 152. The robot 102 successively moves the adhesive transfer tool 152 to a position over the adhesive source 106 and then to various positions over the pallet 150. The adhesive transfer tool 152 transfers a precisely controlled quantity or portion of adhesive to desired locations on each of the substrates 40 during these successive moves. A detailed description of the adhesive transfer process is provided later hereinbelow.

After adhesive is applied to each of the substrates 40, the adhesive transfer tool 152 is replaced in the tool rack 108. The tool holder 118 then engages with a conventional pallet transfer tool 154. The robot 102 then uses the pallet transfer tool 154 to move the pallet 150 from the pallet support 110 to the pallet support 142 on the manipulator 104.

The manipulator 104 places the devices 42 onto the substrates 40. The camera 140 is used to find an orientation of one of the substrates 40 with respect to x and y axes of the x-y stage 126. The rotatable stage 128 is rotated to align the substrate 40 with the x and y axes of the x-y stage 126. The die collet drive 132 is positioned, by movement of the x-y stage 126, over one of the devices 42 and the die collet (not shown) is engaged with the device 42. The die collet is then positioned over a desired location of the substrate 40, i.e., a location on which adhesive has been applied. The device 42 is lowered onto the adhesive 203 at the desired location. This process is repeated until all of the devices 42 are placed on the substrates 40. A detailed description of the placement operation is provided later hereinbelow.

Figure 12:
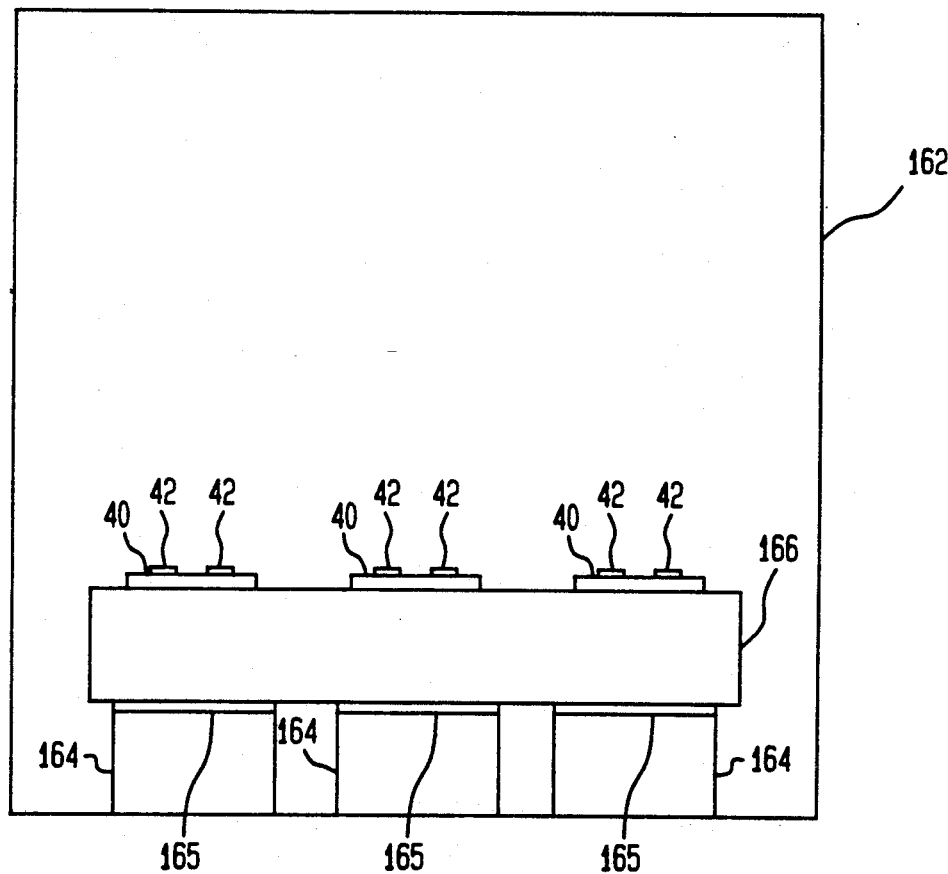
FIG. 12 is schematic view of an apparatus for curing an adhesive interface between a device and a substrate after the device is placed on the substrate in accordance with the present invention.

After the placement process is completed, the pallet 150 is removed from the apparatus 100 by an operator and placed in a curing apparatus 160 which is shown in FIG. 12.

We have found that vibrations produce a deleterious effect during curing of the adhesive 203. If left uncontrolled, these vibrations cause relative motion between the devices 42 and the substrates 40 when the adhesive 203 is in a fluid state during curing. It is possible to isolate a curing oven from external vibrations by placing the oven on a vibration damping unit. However, a typical curing oven produces its own vibrations during operation. These oven-produced vibrations cause minute lateral shifting of the devices 42 relative to the substrates 40 during curing of the adhesive 203.

Referring now to FIG. 12, there is shown a curing apparatus 160 for curing an adhesive interface between the devices 42 and the substrates 40 after the device is placed on the substrate in accordance with the present invention. The curing apparatus is disclosed and claimed in a pending U.S. Patent Application which is cited in the Cross Reference to Related Patent Applications section hereinabove. The curing apparatus 160 comprises a conventional curing oven 162, vibration isolation cylinders 164, leveling shims 165 and a support plate 166. The vibration isolation cylinders 164 rest on one interior surface of the curing oven 162 and the support plate 166 rests on the cylinders 164. The substrates 40 rest on the support plate 166. In a preferred embodiment of the apparatus 160, the vibration isolation cylinders are made of solid medium density polyurethane and are approximately one inch in diameter and 0.75 inches high. In the preferred embodiment, the support plate 166 is a brass plate approximately 0.75 inches thick, 15 inches long and 9 inches wide. An important characteristic of the support plate is that its mass must be orders of magnitude greater than the mass of any of the substrates 40 supported thereon. The support plate 166 in a preferred embodiment weighs approximately 30 pounds and this mass is about 1000 times or greater than the mass of one of the substrates 40.

When Ablebond 84 1LMi is used as an adhesive, the curing takes place at 150° C. for a period of one hour.

In a preferred embodiment of the curing apparatus 160, three of the vibration isolation cylinders are used to form a three point support system for the support plate 166. The leveling shims 165 are used in various thicknesses to achieve a precise leveling of the support plate 166. It has been found advantageous to use a bubble level with an accuracy of ±10 seconds of arc (not shown) when performing the leveling of the support plate 166.

In operation, the curing apparatus 160 acts to prevent any undesired lateral movement between the devices 42 and the substrates 40 during curing of the dots 44 and lines 46 of adhesive. Such undesired lateral movement typically results from vibrations generated by normal operation of conventional curing ovens. The vibration isolation cylinders 164 act in combination with the support plate 166 to prevent vibrations that arise from normal operation of the curing oven 162 from being transmitted to the substrates 40.

Use of the vibration isolation cylinders 164 and the massive support plate 166 precludes a need to clamp the devices 42 to the substrates 40 during the curing of the dots 44 and lines 46 of adhesive to avoid any lateral movement of the devices 42 relative to the substrates 40. Clamping of the devices 42 with a uniformity of force sufficient to control lateral displacement is not practical in many cases. The apparatus 160 allows the devices 42 to maintain their proper positioning relative to the substrates 40 during curing simply through the operation of gravitational force.

Referring now to FIGS. 11, 13, 14 and 15, there follows hereinbelow a detailed description of some of the apparatus and the process of adhesive transfer.

Figure 13:
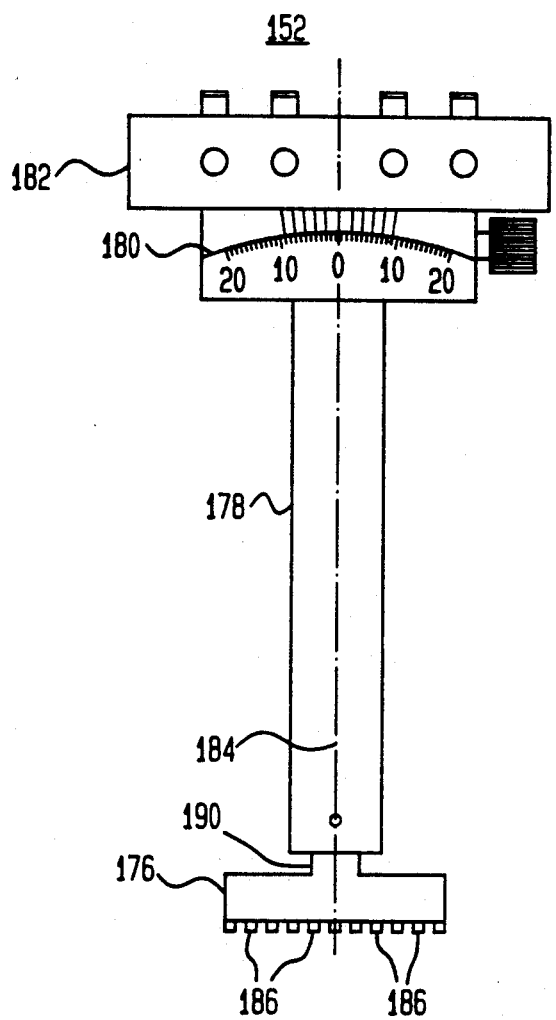
FIG. 13 shows an adhesive transfer tool of the apparatus of FIG. 11.

Referring now specifically to FIG. 13, there is shown a detailed illustration of the adhesive transfer tool 152. The adhesive transfer tool 152 comprises a movable member 176, a support member 178, a goniometer 180 and a robotic coupler 182. The movable member 176 comprises transfer surfaces 186 and a support shaft 190 and is adapted to move inwardly and outwardly along an axis 184 of the support member 178. The robotic coupler 182 is adapted to be assembled with the robot 102 shown in FIG. 11 with the axis 184 aligned with the point 122.

Figure 14:
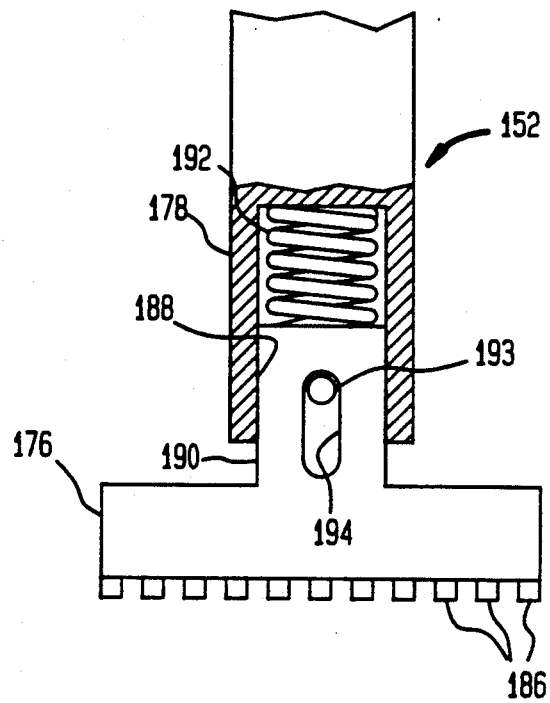
FIG. 14 is a detailed view of a portion of the adhesive transfer tool shown in FIG. 13.

Referring now specifically to FIG. 14, there is shown a detailed illustration of a portion of the adhesive transfer tool 152 of FIG. 13 with a portion of the support member 178 removed for purposes of clarity. The transfer surfaces 186 of the movable member 176 are formed in a configuration that corresponds to a desired pattern of the lines 46 and/or the dots 44 of adhesive (shown in FIG. 10) that is to be applied to the substrate 40. The support member 178 is provided with an opening 188 that accommodates the support shaft 190. A spring 192 is positioned in the opening 188 and bears against the support member 178 and the support shaft 190. A retaining pin 193 prevents the support shaft 190 from being forced out of the support member 178 by the spring 192. The retaining pin 193 passes through a slotted hole 194 in the support shaft 190 and both ends of the pin engage with the support member 178.

The adhesive transfer tool 152 can be readily removed from the tool holder 118 whenever there is a need to change the type of product which is being produced. A different one of the adhesive transfer tools 152 with a different pattern of the transfer surfaces 186 can then be placed in the tool holder 118 of the apparatus 100 of FIG. 11.

Figure 15:
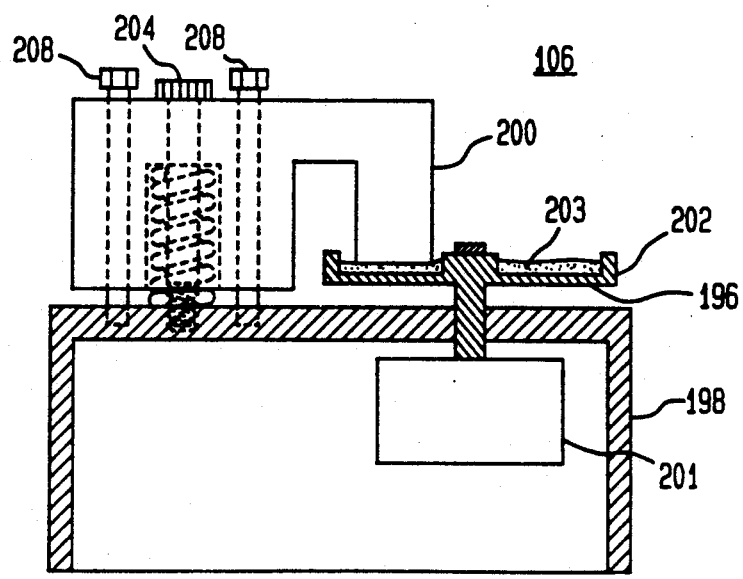
FIG. 15 is cross-sectional view of a portion of the apparatus of FIG. 11 taken along the dashed lines 15—15.

Referring now specifically to FIG. 15, there is shown a cross-sectional view of the adhesive source 106. The adhesive source 106 comprises a rotatable adhesive wheel 196, a support stand 198, an adjustable skimming blade 200, and a drive motor 201. The adhesive wheel 196 is provided with a raised lip 202 that forms a container for adhesive 203. The skimming blade 200 is coupled to the support stand 198 with a spring-loaded adjusting screw 204. The skimming blade 200 is also supported with two guide pins 208.

In operation, the adhesive source 106 is loaded with the adhesive 203 by pouring the adhesive 203 from a shipping container (not shown) onto the adhesive wheel 196. The adhesive wheel 196 is slowly rotated by the drive motor 201. The skimming blade 200 is adjusted so that it contacts a top exposed surface of the adhesive 203 on the adhesive wheel 196. As the adhesive wheel 196 rotates past the skimming blade 200, the exposed surface of the adhesive 203 is subjected to a continuous leveling action. This presents a uniform and smooth surface of the adhesive 203 to the adhesive transfer tool 152 of FIG. 13 when loading of the adhesive 203 onto the adhesive transfer tool 152 occurs.

Referring now collectively to FIGS. 11, 13, 14 and 15, loading of the adhesive 203 onto the adhesive transfer tool 152 occurs when the adhesive transfer tool 152 is positioned over the adhesive wheel 196 by the robot 102. The robot 102 lowers the adhesive transfer tool 152 so that the transfer surfaces 186 of the movable member 176 of the adhesive transfer tool 152 are placed into contact with the exposed surface of the adhesive 203. Lowering of the adhesive transfer tool 152 continues until the transfer surfaces 186 are immersed in the adhesive 203 to a depth of 0.002 to 0.005 inches. The adhesive transfer tool 152 is then raised away from the top surface of the adhesive 203. The transfer surfaces 186 are left with a thin coating of the adhesive 203 after the adhesive transfer tool 152 is raised.

After the transfer surfaces 186 are coated with the adhesive 203, the robot 102 moves the adhesive transfer tool 152 to a first desired position over one of the substrates 40. The adhesive transfer tool 152 is then lowered to place the adhesive 203 coated on the transfer surfaces 186 into contact with the substrate 40. When the adhesive transfer tool 152 is lowered to one of the substrates 40, the transfer surfaces 186 are forced into contact with the substrate 40. Downward motion of the adhesive transfer tool 152 continues even after contact is made. The movable member 176 is forced into the support member 178 of the adhesive transfer tool 152 as the spring 192 compresses. The compression of the spring 192 absorbs impact forces and thus prevents damage to the substrate 40. The downward motion of the adhesive transfer tool 152 continuous until the spring 192 is compressed a sufficient amount to produce a force suitable to achieve transfer of the adhesive 203 from the transfer surfaces 186 to the substrate 40. The adhesive 203 adheres to the substrate 40.

The adhesive transfer tool 152 is then raised. Some of the adhesive 203 remains on the surface of the substrate 40 when the adhesive transfer tool 152 is raised away from the substrate 40. The portion of the adhesive 203 which remains on the substrate 40 conforms precisely to the configuration of the transfer surfaces 186.

When Ablebond 84 1LMi is used as the adhesive 203, it is useful to permit it to remain at room temperature for a period of 24 hours before beginning any application to the substrates 40. Ablebond 84 1LMi begins to polymerize whenever its temperature is raised above zero degrees Fahrenheit. A slight amount of polymerization occurs during the 24 hour exposure to room temperature and this increases the viscosity of the Ablebond 84 1LMi. The increased viscosity results in the Ablebond 84 1LMi being transferred to the transfer surfaces 186 in a pattern the corresponds exactly to the configuration of the transfer surfaces 186. If the Ablebond 84 1LMi is used without permitting this increase in viscosity to occur, the Ablebond 84 1LMi forms a pattern with poor definition. If the Ablebond 84 1LMi is allowed to polymerize for more than 36 hours its viscosity becomes excessive. Excessive viscosity results in undesirable bridging between closely spaced adjacent portions of the transfer surfaces 186. Such bridging is of course unacceptable because it results in placement of the Ablebond 84 1LMi at undesired locations on the substrates 40. It has been found that when the Ablebond 84 1LMi is permitted to attain the above described increase in viscosity, one of the transfer tools 152 can be used to continuously transfer the Ablebond 84 1LMi to the substrates 40 for a period of 8 hours before it becomes necessary to clean the transfer surfaces 186.

It is critical to the operation of the apparatus 100 that the movable member 176 not be permitted to rotate about the axis 184 as adhesive transfer is taking place. A typical one of the devices 42 may be up to 3 inches in length. If the movable member 176 were to rotate about the axis 184 even as much as one tenth of a degree, a intolerable positioning error of the adhesive 203 would occur. In order to preclude this undesirable rotation, the opening 188 in the support member 178 is formed with a rectangular cross section. In a preferred embodiment of the adhesive transfer tool 152, the opening 188 is formed with a square cross section. The use of Electrical Discharge Machining (EDM) is a useful technique in attaining a precisely shaped square cross section for the opening 188.

The adhesive transfer tool 152 is attached to the robot 102 with the coupler 182 through the goniometer 180. This arrangement facilitates an accurate planar alignment of the transfer surfaces 186 with the substrates 40. If any planar misalignments are found when one of the adhesive transfer tools 152 is placed in the robot 102, the goniometer 180 is adjusted to compensate for the misalignment.

The apparatus 100 is capable of depositing controlled quantities of the adhesive 203 onto the substrates 40 at locations that are precisely predictable. This precision is achieved through various design features of the apparatus 100. First, the robot 102 precisely positions the axis 184 of the adhesive transfer tool 152 over desired locations on each of the substrates 40. Second, the transfer surfaces 186 are machined with great precision into an outer surface of the movable member 176 of the adhesive transfer tool 152. In a preferred embodiment of the present invention, the movable member 176 is made from aluminum. The transfer surfaces 186 are machined with sharp edges and with dimensional tolerances in the order of ±0.001 inches. Thus when the transfer surfaces 186 are brought into contact with the adhesive 203, there is precise control over the amount and configuration of the adhesive 203 applied to the transfer surfaces 186. The precise size and the sharp edges of the transfer surfaces 186 result in a very well defined pattern of the adhesive 203 being applied to the adhesive transfer tool 152. This well defined pattern of the adhesive 203 is carried to a precisely defined location over one of the substrates 40 when the robot 102 moves the adhesive transfer tool 152 into a desired position.

The robot 102 is equipped with the camera 120 that facilitates a placement of the point 122 directly over the desired location of the substrate 40 irrespective of any variations of location which the substrate may have with respect to the pallet 150 or the pallet support 110. The camera 120 is used to locate target points (not shown) on the substrate 40. For each of the substrates 40, there is a predetermined spatial relationship between the desired location for the adhesive and the target points. When the camera 120 locates the targets, commands are created for the robot 102 to translate the point 122 in a series of moves that is unique to the particular substrate 40 under the camera 120. The robot 102 then responds to these substrate-specific commands to transfer the adhesive 203 to all of the desired locations on that substrate 40.

The adaptability of the apparatus 100 to product changes can be well understood when consideration is given to the steps used to assemble the product shown in FIG. 10. In that product three separate devices 42a, 42b and 42c are assembled on one of the substrates 40. The adhesive lines 46 and adhesive dots 44 are formed in a different pattern for each of the three devices 42a, 42b and 42c. To form the adhesive pattern for the device 42a, a first one of the adhesive transfer tools 152 is used. The first adhesive transfer tool 152 is sequentially moved back and forth between the adhesive source 106 and the substrates 40 until all of the substrates 40 contained in the pallet 150 are provided with an adhesive pattern at their respective device 42a positions. After all of the device 42a patterns are formed, the first adhesive transfer tool 152 is removed from the robot 102 and replaced with a second one of the adhesive transfer tools 152. The second adhesive transfer tool 152 is provided with a second one of the movable members 176 that has its transfer surfaces 186 formed with a pattern that corresponds to the adhesive pattern required to assemble the devices 42b. This second movable member 176 is then used to apply the device 42b adhesive pattern to all of the substrates 40 in the pallet 150. The sequence of steps is repeated with a third one of the adhesive transfer tools 152 for the adhesive pattern for the device 42c.

All of these changes are performed in a quick and convenient manner due to the accommodating configuration of the apparatus 100. Indeed the robot 102 performs the interchanging of the adhesive transfer tools 152 as part of its programmed actions.

Figure 16:
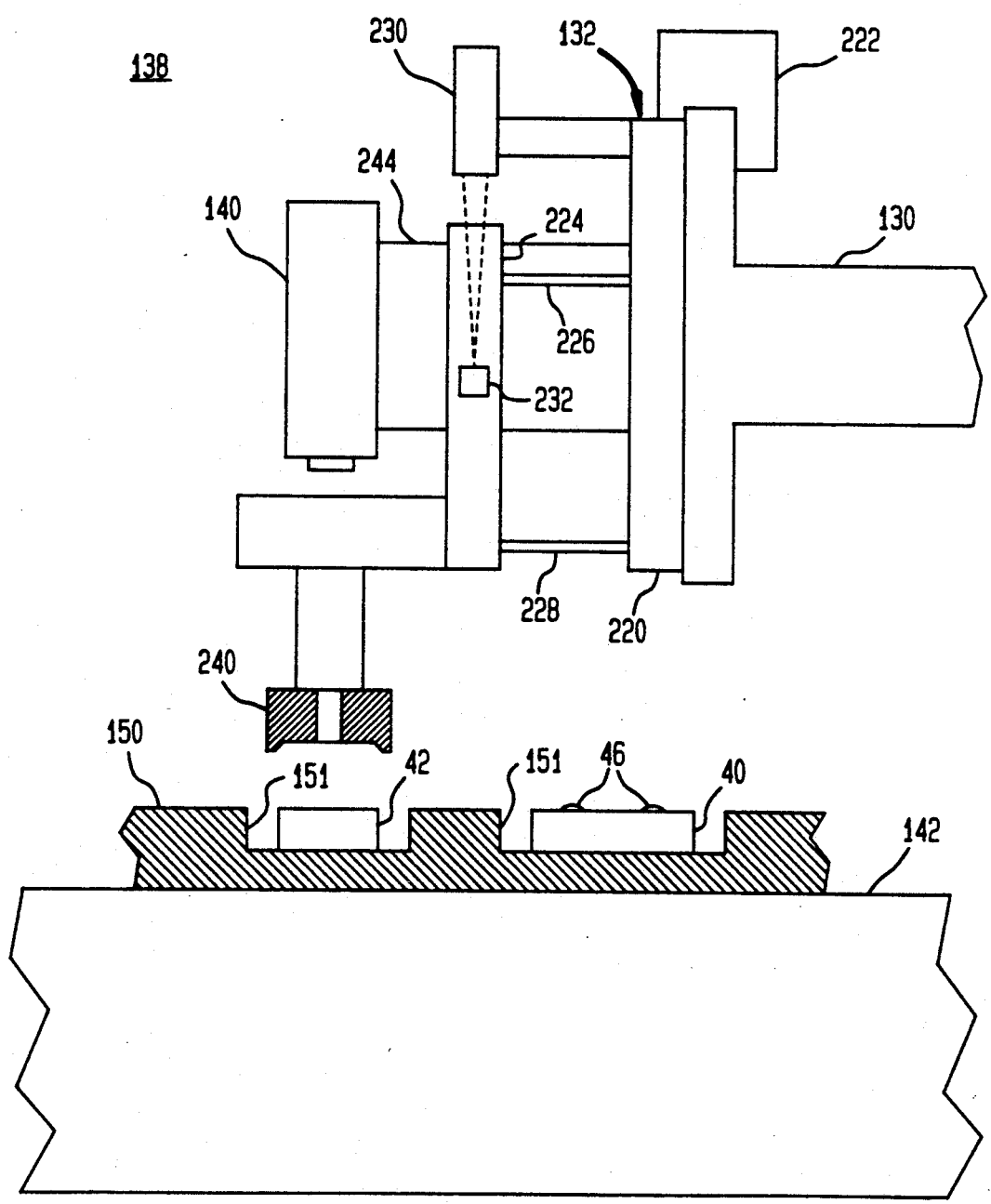
FIG. 16 is a view of the apparatus of FIG. 11 taken along the dashed line 16—16 during a first operation thereof.
Figure 17:
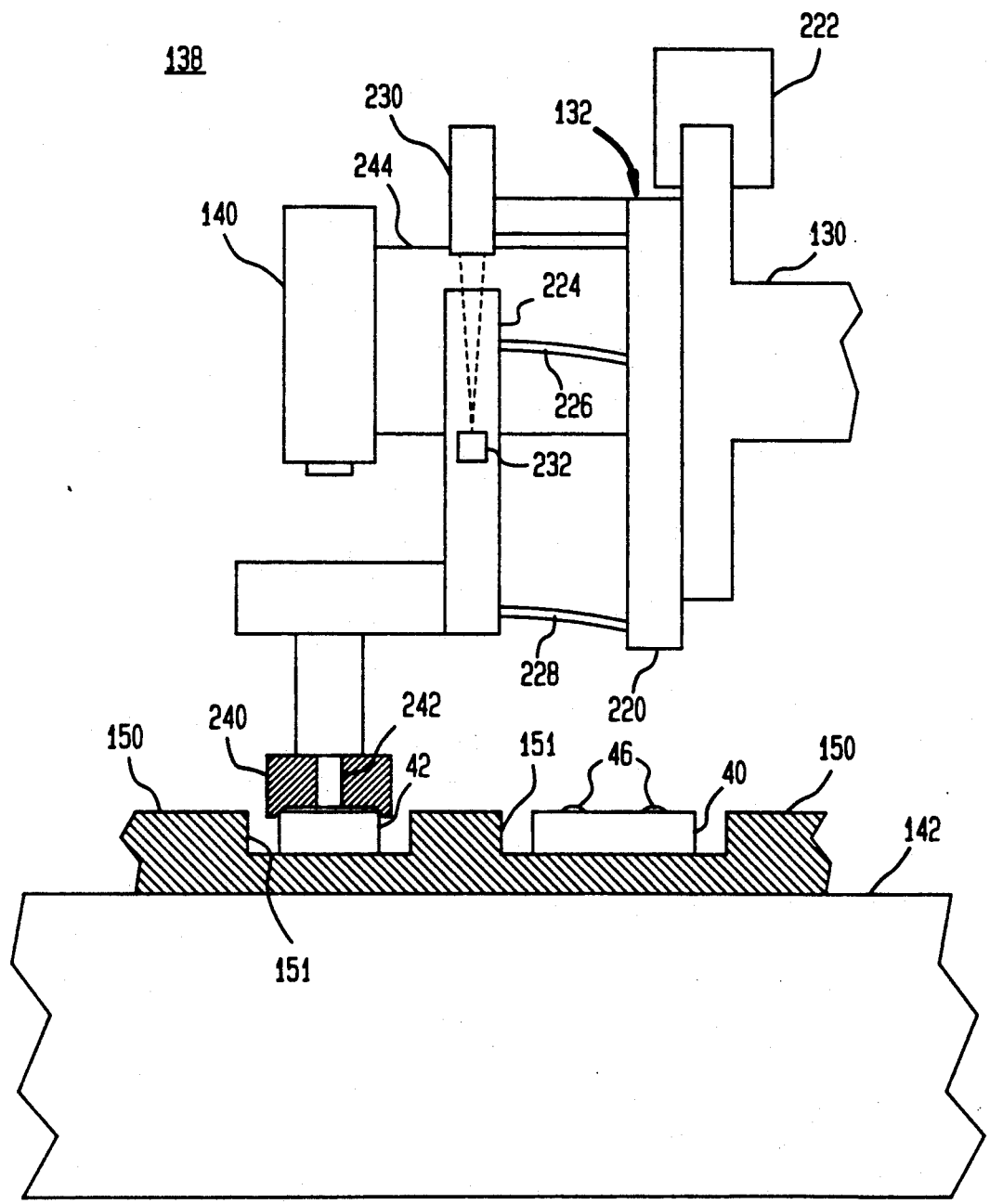
FIG. 17 shows the same apparatus as FIG. 16, but during a second operation thereof.
Figure 18:
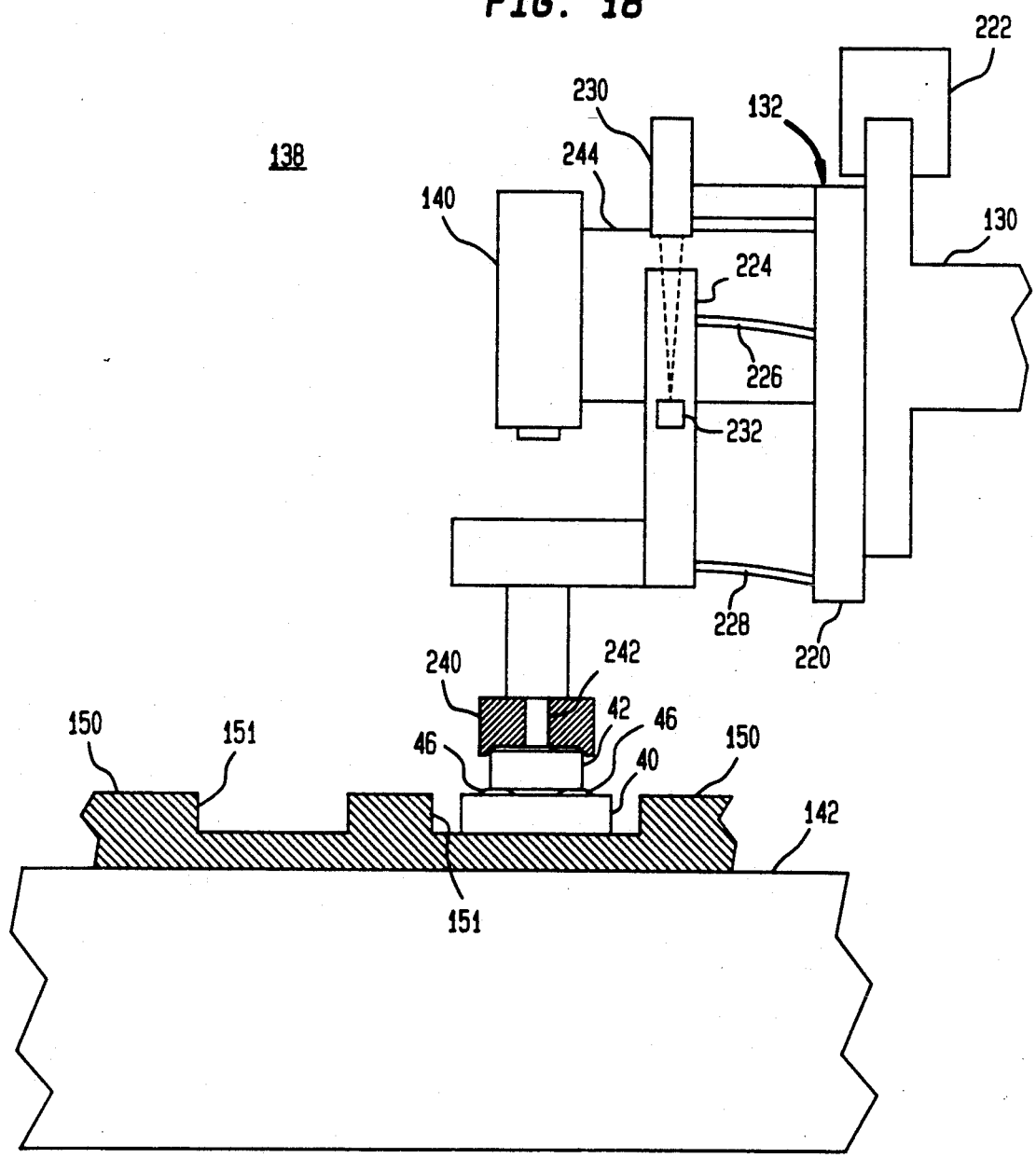
FIG. 18 shows the same apparatus as FIG. 16, but during a third operation thereof.

Referring now to FIGS. 16, 17, and 18, there are shown various steps used for the assembling of the devices 42 and the substrates 40.

Referring now specifically to FIG. 16, there is shown a view of a device placement portion 138 of the manipulator 104 of FIG. 11 positioned above one of the cavities 151 of one of the pallets 150 containing the devices 42 and the substrates 40 with the lines 46 of adhesive formed thereon. The device placement portion 138 facilitates a placement of the devices 42 onto the substrates 40 with a controlled force in accordance with the present invention. FIG. 16 shows the die collet drive 132, the beam 130, the camera 140 and the pallet support 142 of FIG. 11. The die collet drive 132 comprises a driven plate 220, a conventional drive motor 222, a floating plate 224, first and second leaf springs 226 and 228, respectively, an optical distance sensor 230, a reflecting target 232, and a die collet 240. In a preferred embodiment of the die collet drive 132, the optical distance sensor is a Keyence PT-A170 Optical Positioning Sensor. The die collet 240 is shown in a sectional illustration for purposes of clarity.

The driven plate 220 of the die collet drive 132 is moveably coupled to the beam 130. The driven plate 220 is moved vertically by the drive motor 222 and is coupled thereto by a conventional gearing system (not shown). The driven plate is also coupled to the sensor 230. The floating plate 224 is coupled to the two leaf springs 226 and 228 at first ends thereof, to the die collet 240 and to the reflecting target 232. Second ends of the leaf spring 226 and 228 are coupled to the driven plate 220. The camera 140 is coupled to the support beam 130 by a mounting plate 244.

In operation, the devices 42 are placed on the substrates 40 in a series of steps which are made in response to commands provided to the manipulator 104 of FIG. 11.

Referring now specifically to FIG. 17, there is shown the portion 138 of the manipulator 104 with the die collet 240 thereof positioned over and in contact with one of the devices 42. The die collet 240 is moved to the position shown in FIG. 17 from the position shown in FIG. 16 by a lowering action of the drive motor 222 moving the driven plate 220. Even after the die collet 240 makes contact with the device 42, the driven plate 220 continues its downward motion. After the die collet 240 contacts the device 42, continued downward motion of the driven plate 220 causes the floating plate 224 to move upwardly relative to the driven plate 220. The relative upward motion of the floating plate 224 continues until the reflecting target 232 moves a predetermined distance relative to the sensor 230. After the predetermined relative movement, a conventional control system (not shown) stops the drive motor 222 and the downward motion of the driven plate 220 is stopped. This results in a predetermined amount of force being applied to the device 42 by the die collet 240. The leaf springs 226 and 228 deflect when there is relative motion between the driven plate 220 and the floating plate 224. This deflection is proportional to the force applied to the device 42 by the die collet 240. The deflection is limited to a predetermined amount by the action of the sensor 230 and the target 232. Consequently, the force applied by the die collet 240 is limited to a predetermined amount.

After the driven plate 220 has completed its downward motion, the die collet 240 is placed into a lifting mode. This is done by applying vacuum or negative pressure to an opening 242 formed through the die collet 240 from a conventional vacuum pump (not shown).

Referring now specifically to FIG. 18, there is shown the portion 138 of the manipulator 104 with the die collet 240 thereof positioned over the substrate 40. The die collet 240 is moved from the position shown in FIG. 17 to the position shown in FIG. 18 by a combination of motions produced by the drive motor 222 and the x-y stage 126 of the manipulator 104 of FIG. 11.

The device 42 is shown in contact with and slightly deflecting the lines 46 of the adhesive on the substrate 40. The force used to achieve this slight deflection of the lines 46 of adhesive must be very carefully controlled. If the device 42 is pressed into the lines 46 of adhesive with an excess of force, the device 42 is likely to break because it is extremely brittle. If the device 42 is placed onto the lines 46 of adhesive with insufficient force, the device 42 may shift relative to the substrate 40 during curing. This is so because there is a possibility that all the lines 46 of adhesive will not have exactly the same thickness. Pressing the device 42 onto the lines 46 assures all of the lines 46 under the device 42 are pressed into a uniform thickness. Consequently pressing the device 42 onto the lines 46 of adhesive helps to provide a uniform supporting base for the devices 42 during curing of the adhesive.

This application force is controlled within critical limits through the operation of the sensor 230 and the reflecting target 232 discussed above. The die collet drive 132 continues to lower the driven plate 220 even after the device 42 engages with lines 46 of adhesive. This continued motion produces a deflection of the adhesive 203 and a deflection of the leaf springs 226 and 228. These two forms of deflection continue until the target 232 moves a predetermined distance relative to the sensor 230. This predetermined distance in a preferred embodiment of the apparatus 100 is less than 0.005 inches. FIGS. 17 and 18 show this distance in an exaggerated manner for illustrative purposes. When this predetermined distance is reached, the device 42 is embedded onto the lines 46 of adhesive with a predetermined force that is within the critical range. In a preferred embodiment this predetermined force is 11 grams, ±0.5 grams. It has been found that the above described force control apparatus is particularly useful in the assembly of semiconductor devices when the desired force to be applied by the die collet 240 is less than about 20 grams.

During the movement of the die collet 240, commands for the x-y stage 126 of FIG. 11 are produced with inputs from the camera 140. Consequently, it is necessary to maintain a precisely defined spatial relationship between the camera 140 and the device 42 held in the die collet 240. The leaf springs 226 and 228 form very stable coupling members between the driven plate 220 and the floating plate 224. The leaf springs 226 and 228 permit virtually no relative x-y motion between the two plates 220 and 224. The x-y relationship between the camera 140 and the device 42 held in the die collet 240 remains essentially unchanged during movements of the die collet 240. This desirable stability is a function of the geometry of the leaf springs 226 and 228 and the two plates 220 and 224. In a preferred embodiment each of the leaf springs 226 and 228 is a steel parallelogram that is approximately 1.5 inches square and 0.005 inches thick. The leaf springs 226 and 228 can be of any thickness, but it has been found that when the above described force control apparatus is used to produce forces less than 20 grams, the leaf springs are typically less than about 0.010 inches thick.

The portion 138 of the manipulator 104 is additionally useful in that it permits the manipulator 104 to be used with devices which have various thicknesses. While the manipulator has been described above in the context of assembling the devices 42 with the substrates 40, it must be recognized that the manipulator may be used to assemble a wide array of different products. Different products typically use devices with different thicknesses. The manipulator 104 will apply the same predetermined assembly force to any device, irrespective of the thickness or size of the device. Consequently the manipulator 104 is readily adaptable to assembly of many styles and types of products.

It is to be appreciated and understood that the specific embodiments of the invention are merely illustrative of the general principles of the invention. Various modifications may be made by those skilled in the art which are consistent with the principles set forth. For example, even though the apparatus has been described in the context of assembling semiconductor devices, the inventive concepts are applicable to the assembly of a wide range of electrical or non-electrical objects.

What is claimed is:

1. Apparatus for facilitating the bonding of a semiconductor device to a substrate via an adhesive interface therebetween, said apparatus comprising:
    means for supporting the substrate;
    means for moving the semiconductor device relative to the substrate;
    the moving means having a driven member and a floating member;
    the driven member and the floating member being coupled to each other with at least two substantially square leaf springs which are displaced from each other to form a coupling that causes the floating member to move on an axis that is essentially parallel to an axis of movement of the driven member when there is relative movement between the driven member and the floating member;
    the floating member being adapted to hold the semiconductor device;

the driven member having an optical distance sensor coupled thereto;

the optical distance sensor being adapted to measure a displacement of the floating member relative to the driven member; and the optical distance sensor being coupled to control means adapted to move the driven member to place the semiconductor device into contact with an adhesive interface formed on the substrate and continue the movement of the driven member until the optical distance sensor has measured a predetermined displacement of the floating member relative to the driven member.

2. The apparatus of claim 1 wherein the leaf springs have a thickness less than about 0.010 inch and the predetermined relative movement between the floating member and the driven member is limited to less than about 0.05 inch whereby the force on the semiconductor device is controlled to vary no more than about 0.5 grams during placement of the semiconductor device onto the adhesive interface.

* * * * *